United States Patent [19]

Espinor et al.

[11] Patent Number: 5,890,191

[45] Date of Patent: Mar. 30, 1999

[54] METHOD AND APPARATUS FOR PROVIDING ERASING AND PROGRAMMING PROTECTION FOR ELECTRICALLY ERASABLE PROGRAMMABLE READ ONLY MEMORY

[75] Inventors: George L. Espinor; Michael I. Catherwood, both of Austin, Tex.

[73] Assignee: Motorola, Inc., Schaumburg, Ill.

[21] Appl. No.: 644,098

[22] Filed: May 10, 1996

[51] Int. Cl.⁶ .......................... G06F 12/16; G11C 16/04
[52] U.S. Cl. .................... 711/103; 711/163; 365/185.01; 365/185.18; 365/185.27
[58] Field of Search .................... 711/103, 163; 365/185.04, 185.18, 185.27

[56] References Cited

U.S. PATENT DOCUMENTS

| | | | |
|---|---|---|---|
| 4,796,235 | 1/1989 | Sparks et al. | 365/185.07 |
| 5,199,032 | 3/1993 | Sparks et al. | 371/3 |
| 5,267,218 | 11/1993 | Elbert | 365/226 |
| 5,339,279 | 8/1994 | Toms et al. | 365/185.11 |
| 5,363,334 | 11/1994 | Alexander et al. | 365/185.04 |
| 5,513,136 | 4/1996 | Fandrich et al. | 365/185.04 |
| 5,592,641 | 1/1997 | Fandrich et al. | 711/103 |

OTHER PUBLICATIONS

Motorola, Inc., "HCO5—Technical Data," MC68HC05B6 High–Density Complementary Metal Oxide Semiconductor (HCMOS) Microcomputer Unit, 1994, pp. 3–3 through 3–7.

Motorola, Inc., "HC11 M68CH11 E Series—Technical Data," 1995, pp. 4–18 through 4–22.

Atmel, "8–Bit Microcontroller with 1 Kbyte Flash," AT89C1051 On–Line Data Sheet, 1996, pp. 3–3 through 3–16.

*Primary Examiner*—Reginald G. Bragdon
*Attorney, Agent, or Firm*—Susan C. Hill; J. Gustav Larson

[57] ABSTRACT

Method and apparatus for providing erasing and programming protection of an EEPROM (22) to significantly reduce the possibility of unintentional erasing or programming of the EEPROM (22). In one embodiment, a read access of a block protect value (111) is a requirement for enabling the EEPROM charge pump (78). The block protect value (111) may be located in the EEPROM array (22) itself. In one embodiment, an externally provided signal (24) must be provided to an integrated circuit (10) in order to enable a write access to modify the block protect value (111). In one embodiment, a charge pump enable value (103) is provided to enable or disable operation of the charge pump (78). Thus, a combination of hardware and software protection is provided for an EEPROM (22), including protection for enabling of a charge pump (78).

16 Claims, 6 Drawing Sheets

5,890,191

METHOD AND APPARATUS FOR PROVIDING ERASING AND PROGRAMMING PROTECTION FOR ELECTRICALLY ERASABLE PROGRAMMABLE READ ONLY MEMORY

FIELD OF THE INVENTION

The present invention relates in general to Electrically Erasable Programmable Read Only Memory, and more particularly to a method and apparatus for providing erase and program protection for Electrically Erasable Programmable Memory.

BACKGROUND OF THE INVENTION

Non-volatile memories are commonly used in data processing systems. Electrically Erasable Programmable Read Only Memory (EEPROM) is one type of non-volatile memory which is commonly used. In this document, Electrically Erasable Programmable Read Only Memory, Electrically Erasable PROM, and EEPROM will all be used interchangeably to include all types of non-volatile memory that may be electrically erasable, including byte erasable, block erasable, bulk erasable, and flash memories, each of which may store any type of information.

Unfortunately, EEPROM which is electrically alterable by way of an on-chip charge pump circuit may be subject to being altered unintentionally. That is, one or more cells within the EEPROM array may be unintentionally and/or unknowingly altered. This unintentional altering may occur as a result of a brown-out condition or noise in a system. If the brown-out condition or noise causes the system to malfunction and enable the charge pump while addressing a portion of the EEPROM which is not meant to be altered, unintentional altering of the EEPROM may occur. For example, where an EEPROM is located on the same integrated circuit as a processor (e.g. a microcontroller), the microcontroller may malfunction due to low power or noise and may inadvertently enable the charge pump while addressing a portion of the EEPROM which is not meant to be altered.

Any unintentional altering of EEPROM may be completely unacceptable for some applications which use EEPROM. For example, smart card applications which use EEPROM to store the current amount of money available for use with the card may not be able to tolerate any unintentional altering of EEPROM. In some smart card applications, the unintentional altering of EEPROM may result in a significant loss of money to the bank or telephone company supplying the smart card.

There are several prior art approaches to providing erasing and programming protection to an EEPROM. For example, the MC68HC11E9 microcontroller, available from Motorola, Inc. of Austin, Tex., incorporates a type of EEPROM block protection which uses a one-time writeable register to protect the contents of certain address ranges within the on-board EEPROM. The problem with this approach is that it relies on the use of a volatile register to maintain the protection. Under conditions which can cause the processor to malfunction, this register's contents could also be corrupted. The MC68HC05B8 microcontroller, available from Motorola, Inc. of Austin, Tex., uses a similar form of protection which uploads protection information from a location in the EEPROM on reset. However, after reset, the information is still maintained in volatile register bits. The block protect location itself can be altered under normal circuit operation. In addition, at least one prior art microcontroller has a bit in the EEPROM that blocks further programming of the array. Unfortunately, however, this bit can be erased by a bulk erase of the array.

Due to the pressing requirements of some applications using EEPROM, an approach was needed that would even more significantly reduce the possibility of unintentionally altering the EEPROM.

SUMMARY OF THE INVENTION

The present invention includes a method and apparatus for providing erasing and programming protection of an EEPROM to significantly reduce the possibility of unintentional erasing or programming of the EEPROM. In one embodiment, a read access of a block protect value is a requirement for enabling the EEPROM charge pump. The block protect value may be located in the EEPROM array itself. In one embodiment, an externally provided signal must be provided to an integrated circuit in order to enable a write access to modify the block protect value. In another embodiment, a charge pump enable value is provided to enable or disable operation of the charge pump. Thus a combination of hardware and software protection is provided for an EEPROM, including protection for enabling of a charge pump.

DESCRIPTION OF THE PREFERRED EMBODIMENT

Figure 1:
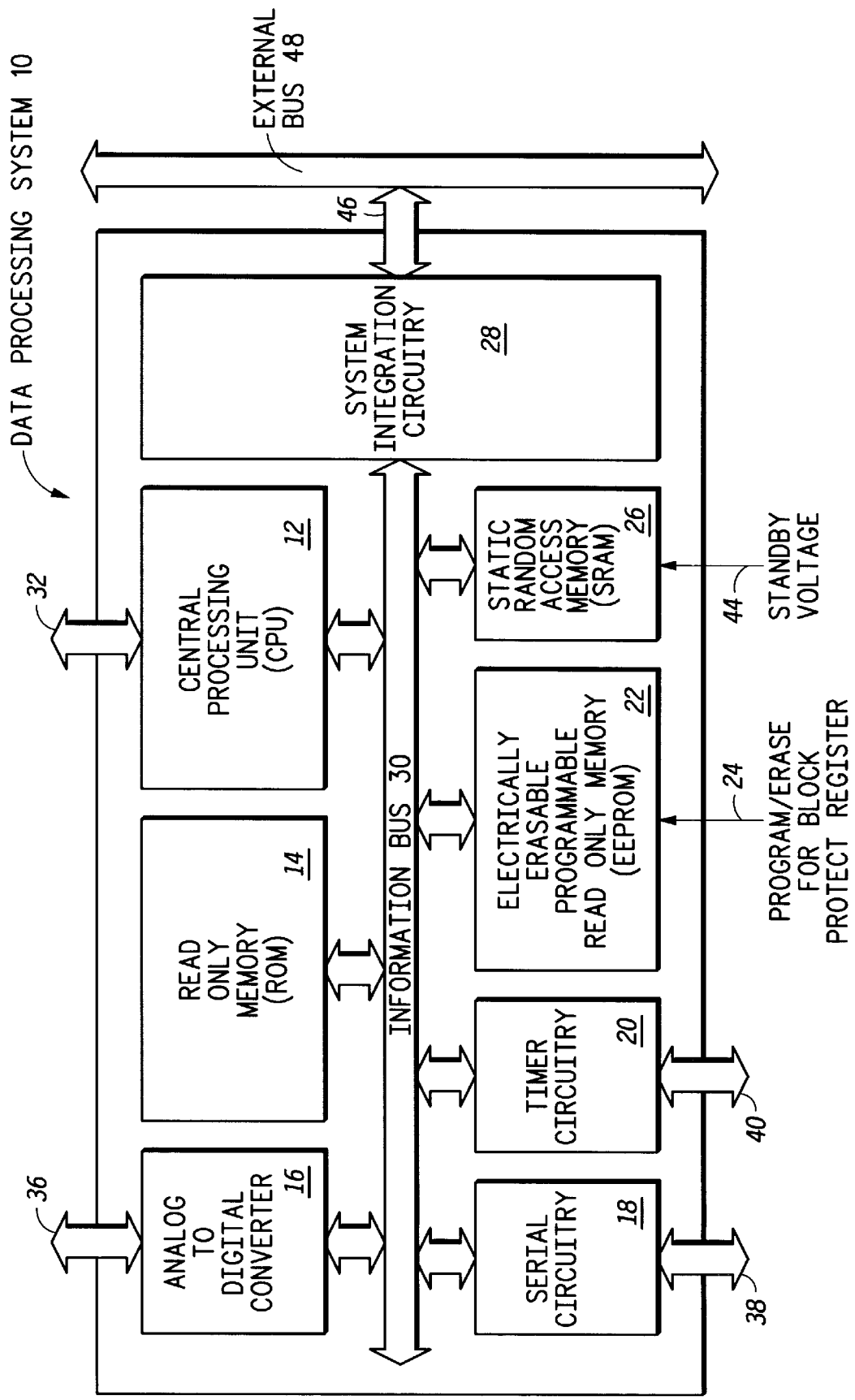
FIG. 1 illustrates, in block diagram form, a data processing system 10 in accordance with one embodiment of the present invention.

The present invention is particularly useful in applications which use embedded EEPROM that can be altered (i.e. erased or programmed) by way of an internal charge pump that operates from a single positive supply voltage, e.g. a VDD power supply voltage. EEPROMs which operate from a single positive supply voltage are becoming more common due to the increase in low voltage and low power applications. The present invention allows a user to protect portions of the EEPROM memory while reserving other portions of the EEPROM memory for easy erasing and reprogramming in the target application, while using only a single positive supply voltage. Protection of the user's software code is very important, and many embedded applications are in harsh environments subject to very noisy conditions.

In one embodiment, the present invention requires that a predetermined location within the EEPROM 22 (see FIG. 2), namely the block protect register bits 111 (see FIG. 4), be read as part of the protection sequence for enabling the charge pump 78. The block protect control circuitry 72 uses the block protect register bits 111 to enable or disable the assertion of the charge pump enable bit 103. The charge pump enable bit 103 turns on the charge pump 78. The charge pump 78 must be turned on in order to erase or program any portion of the EEPROM 22.

In one embodiment of the present invention, the block protect control circuitry 72 latches and holds the block protect register bits 111 and compares them to the address signals representing the portion of the EEPROM 22 for which an erase or program operation is being requested. If an attempt to erase or program a protected location within EEPROM 22 occurs, all previous steps in the erase or program sequence are cleared (see path 713 in FIG. 7). The block protect register bits 111 themselves can only be altered when an externally provided "program/erase for block protect register" signal is asserted on an integrated circuit terminal 24 (see FIG. 1). In one embodiment of the present invention, the "program/erase for block protect register" signal 24 is an externally provided voltage that is a higher positive voltage than the positive power supply voltage, VDD, used to provide power to integrated circuit 10 (see FIG. 1).

The present invention makes a read access of a block protect value 111 (see FIG. 4) a requirement for enabling of the on-board charge pump 78. This read access requirement is forced through hardware interlocking. Also, the requirement that an external signal 24 be used to erase the block protect value 111 prevents the block protect value 111 from becoming accidentally erased.

The terms "assert" and "negate" will be used when referring to the rendering of a signal, status bit, or similar apparatus into its logically true or logically false state, respectively. If the logically true state is a digital logic level one, the logically false state will be a digital logic level zero. And if the logically true state is a digital logic level zero, the logically false state will be a digital logic level one. The term "bus" will be used to refer to a plurality of signals which may be used to transfer one or more various types of information, such as data, addresses, control, or status. The symbol "$" preceding a number indicates that the number is represented in its hexadecimal or base sixteen form. Note that when "user software" is referred to in this document, the term applies to a user written software program that consists of instructions executed by CPU 12 (see FIG. 1).

Description of the Figures

Referring now to the figures, FIG. 1 illustrates a data processing system 10 which can be implemented as a single integrated circuit called a microcontroller. Data processing system 10 has various on-board peripherals which are bi-directionally coupled by way of an information bus 30. The particular embodiment of data processing system 10 illustrated in FIG. 1 has a central processing unit (CPU) 12, a read only memory (ROM) 14, an analog to digital converter 16, serial circuitry 18, timer circuitry 20, EEPROM 22, static random access memory (SRAM) 26, and system integration circuitry 28, which are all bi-directionally coupled to an information bus 30.

System integration circuitry 28 can receive and transmit signals external to data processing system 10 by way of integrated circuit pins 46. Integrated circuit pins 46 may optionally be coupled to an external bus 48. CPU 12 may optionally receive and transmit signals external to data processing system 10 by way of integrated circuit pins 32. Analog to digital converter 16 can receive and transmit signals external to data processing system 10 by way of integrated circuit pins 36. Serial circuitry 18 can receive and transmit signals external to data processing system 10 by way of integrated circuit pins 38. Timer circuitry 20 can receive and transmit signals external to data processing system 10 by way of integrated circuit pins 40. EEPROM 22 can receive a program/erase signal 24 for block protect register 110 (see FIG. 4) by way of integrated circuit pin 24. SRAM 26 can receive a standby voltage signal by way of integrated circuit pin 44.

The embodiment of data processing system 10 which is shown in FIG. 1 illustrates one particular microcontroller within a family of microcontrollers. Because microcontrollers in the same family generally have a plurality of differing on-board peripherals, FIG. 1 provides only one embodiment of data processing system 10. For example, other embodiments of data processing system 10 may not have ROM 14, analog to digital converter 16, or serial circuitry 18. In fact, alternate embodiments of data processing system 10 may have fewer, more, or different on-board peripherals than those illustrated in FIG. 1.

Figure 2:
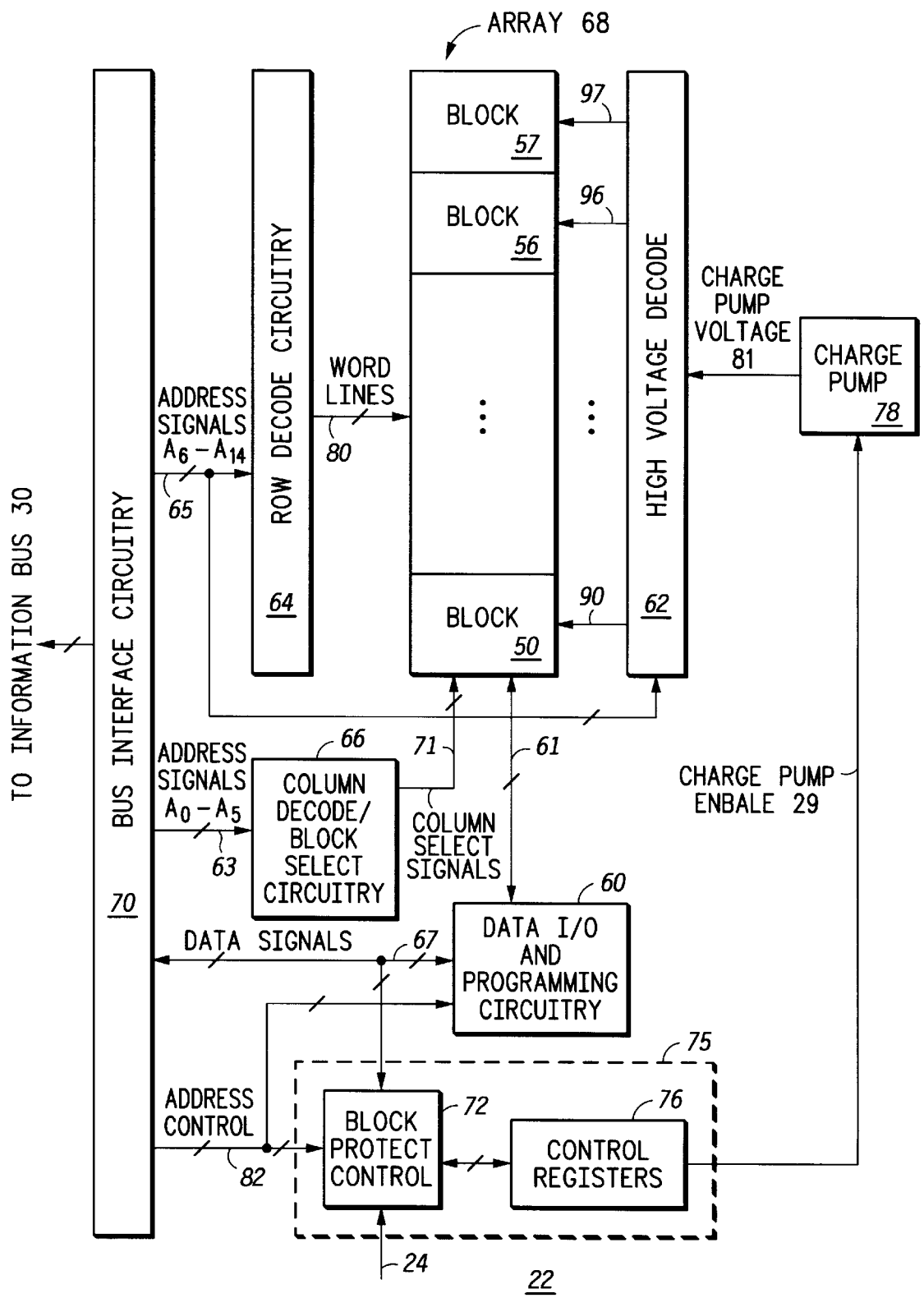
FIG. 2 illustrates, in block diagram form, an EEPROM 22 of FIG. 1 in accordance with one embodiment of the present invention.

FIG. 2 illustrates one embodiment of an EEPROM 22 of FIG. 1. A single array of EEPROM memory cells 68 is divided into a plurality of blocks 50–57. Although the illustrated embodiment is divided into eight blocks, alternate embodiments of the present invention may use any number of blocks. Each block receives a plurality of word lines from row decode circuitry 64. Row decode circuitry 64 receives address signals 65 from bus interface circuitry 70. Although row decode circuitry 64 in the illustrated embodiment receives address signals A6–A14, row decode circuitry 64 in alternate embodiments of the present invention may receive fewer, more, or different address signals. Row decode circuitry 64 is coupled to array 68 by way of word lines 80.

Bus interface circuitry 70 is coupled to information bus 30 in order to allow EEPROM 22 to communicate with other portions of circuitry in data processing system 10. For example, bus interface circuit 70 may receive address and data signals from CPU 12 across information bus 30, and bus interface circuit 70 may transfer data signals back to CPU 12 across information bus 30.

Bus interface circuit 70 transfers address signals to column decode circuitry 66 by way of conductors 63. Although column decode circuitry 66 in the illustrated embodiment receives address signals A0–A5, column decode circuitry 66 in alternate embodiments of the present invention may receive fewer, more, or different address signals.

Bus interface circuit 70 transfers address signals and control signals to block protect control circuitry 72 by way of conductors 82. Bus interface circuit 70 also transfers address signals and control signals to data I/O and programming circuitry 60. Bus interface circuit 70 is bi-directionally coupled to data I/O and programming circuitry 60 to transfer data by way of conductors 67. Data I/O and programming circuitry 60 receives data signals from bus interface circuit 70 and transfers data signals to array 68 by way of conductors 61. In addition, data I/O and programming circuitry 60 receives data signals from array 68 and transfers data signals to bus interface circuit 70. Data I/O and programming circuitry 60 includes circuitry which is used to program the EEPROM cells in array 68.

Column decode circuitry 66 provides signals to array 68 by way of conductors 71. Column decode circuitry 66 provides column select signals to array 68. The present invention uses the same decode circuitry and decodes the same address signals in order to provide both column select signals and block select signals. The column decode signals are used during read accesses and programming. The block select signals are used during erasing and programming.

Bus interface circuit 70 is bi-directionally coupled to control registers 76 so that control registers 76 can be read and written (e.g. by CPU 12). Control registers 76 are coupled to block protect control circuitry 72 and charge pump circuitry 78. Charge pump 78 is coupled to high voltage decoder circuitry 62 to provide a charge pump voltage 81. High voltage decoder circuitry 62 is coupled to block 50–57 of array 68 by way of conductors 90–97, respectively. High voltage decoder circuitry 62 receives address signals 65 from bus interface circuitry 70. Although high voltage decoder circuitry 62 in the illustrated embodiment receives address signals A6–A14, high voltage decoder circuitry 62 in alternate embodiments of the present invention may receive fewer, more, or different address signals.

Circuitry 75 includes block protect control circuitry 72 and control register 76. In one embodiment of the present invention, block protect control circuitry 72 receives the "program/erase for block protect register" signal 24 from external to data processing system 10. Aside from the circuitry illustrated in circuit 75 and the effect this circuitry 75 has on EEPROM 22, the remaining circuitry of EEPROM 22 illustrated in FIG. 2 operates in the same manner as a prior art EEPROM.

Figure 5:
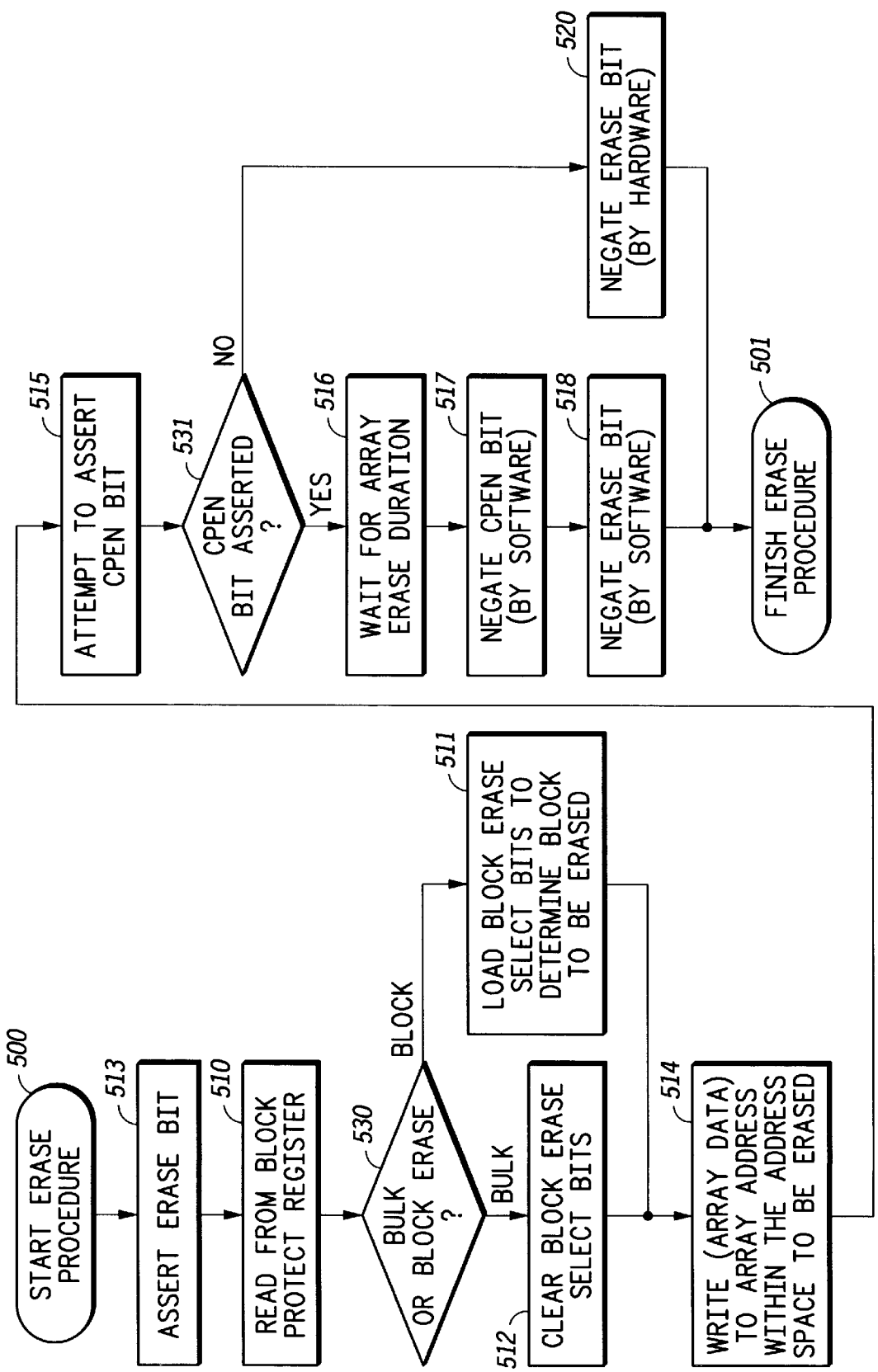
FIG. 5 illustrates, in flow diagram form, an erase procedure in accordance with one embodiment of the present invention.
Figure 6:
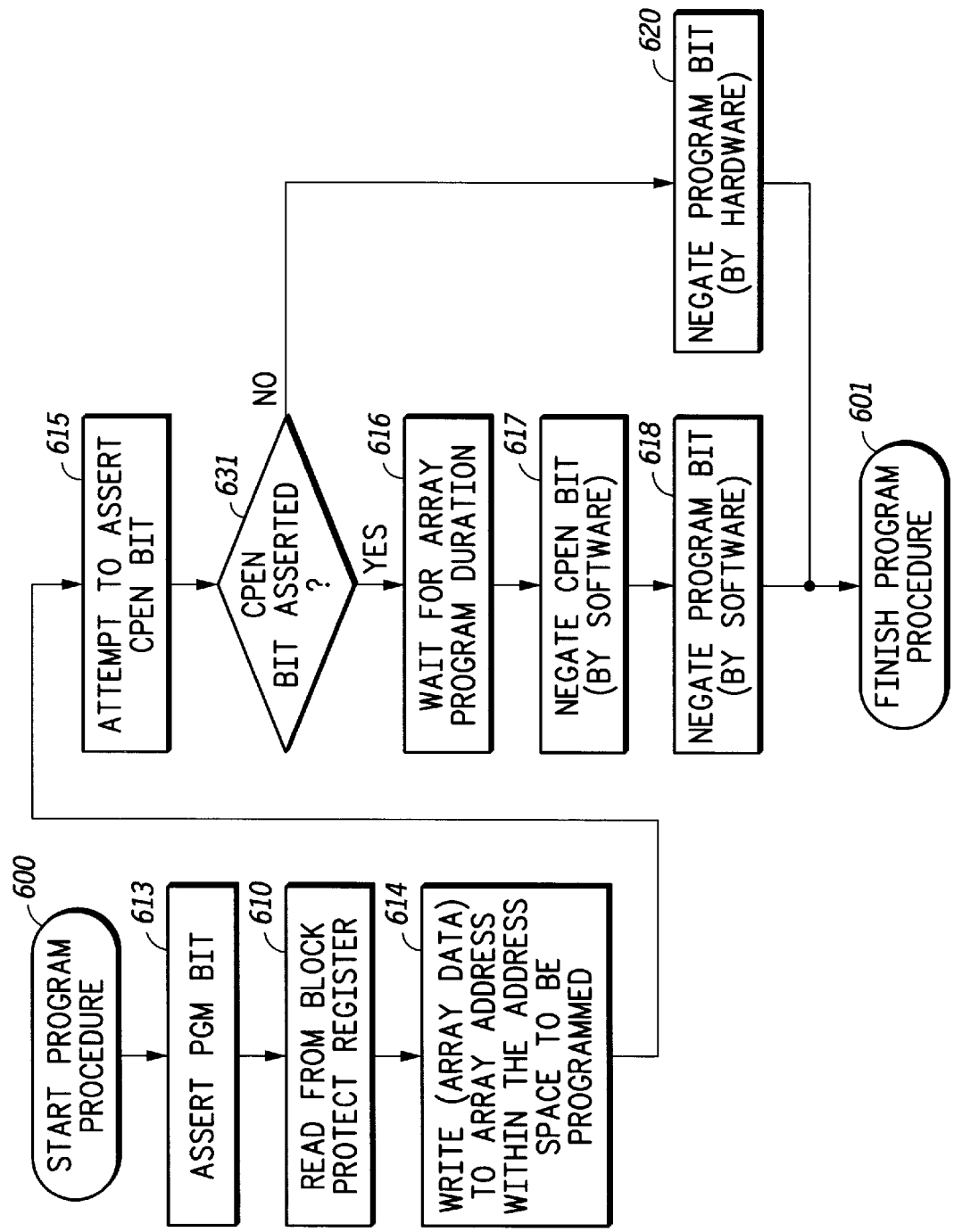
FIG. 6 illustrates, in flow diagram form, a program procedure in accordance with one embodiment of the present invention.
Figure 7:
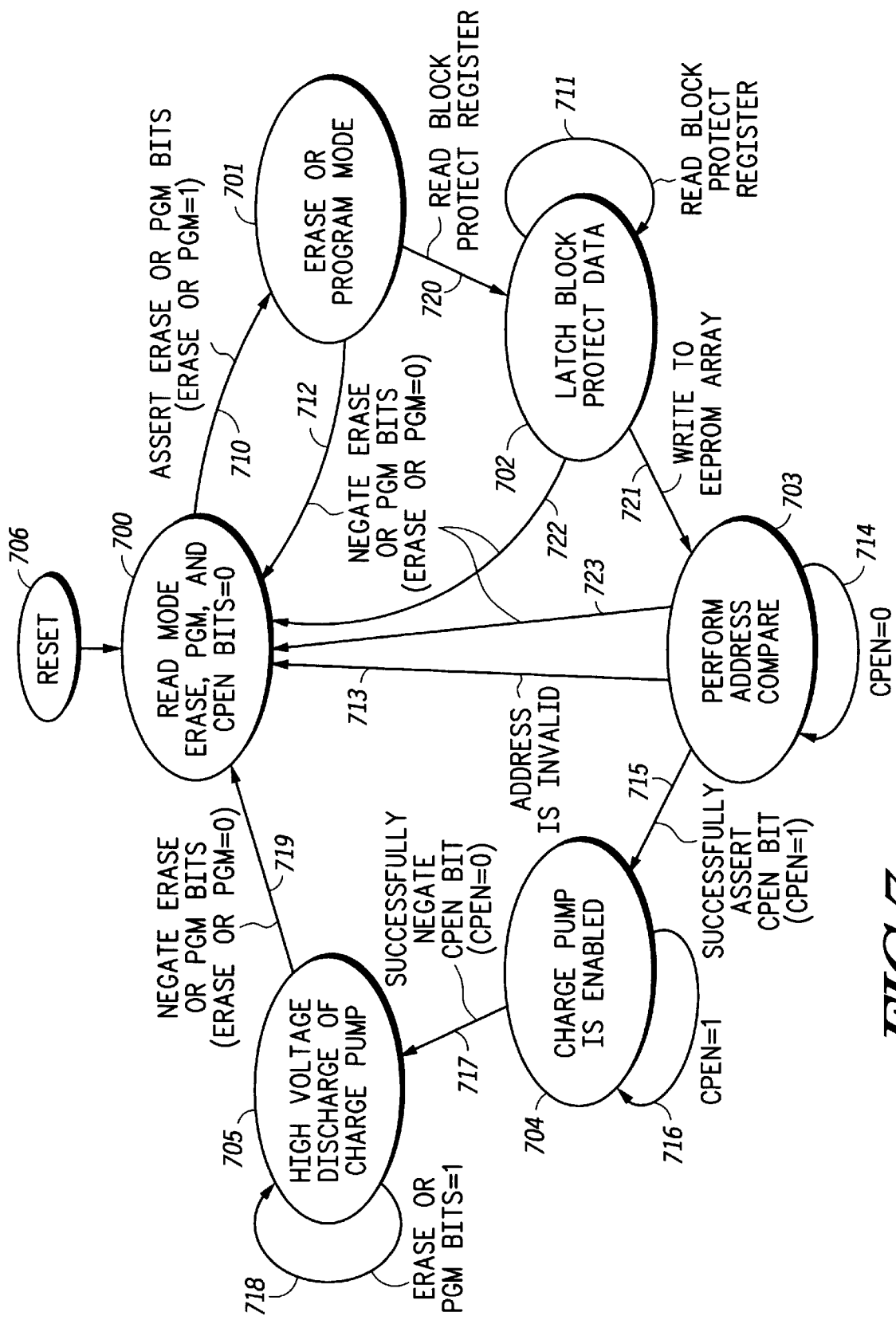
FIG. 7 illustrates, in state diagram form, the operation of the block protect control circuitry 72 of FIG. 2 in accordance with one embodiment of the present invention.

In one embodiment of the present invention, block protect control circuitry 72 and a portion of control registers 76 may be used as protection sequence circuitry to require that a sequence of steps be performed to enable erasing and programming of EEPROM 22 (see FIGS. 5–7). The charge pump enable bit (CPEN) 103 (see FIG. 3) may function as charge pump protection circuitry to enable operation of charge pump 78 as a result of the sequence of steps being successfully completed. In one embodiment of the present invention, control registers 76, or a portion of control registers 76, may be implemented using EEPROM cells. In fact, in some embodiments of the present invention, control registers 76, or a portion of control registers 76, may be implemented using extra EEPROM cells from array 68.

Figure 3:
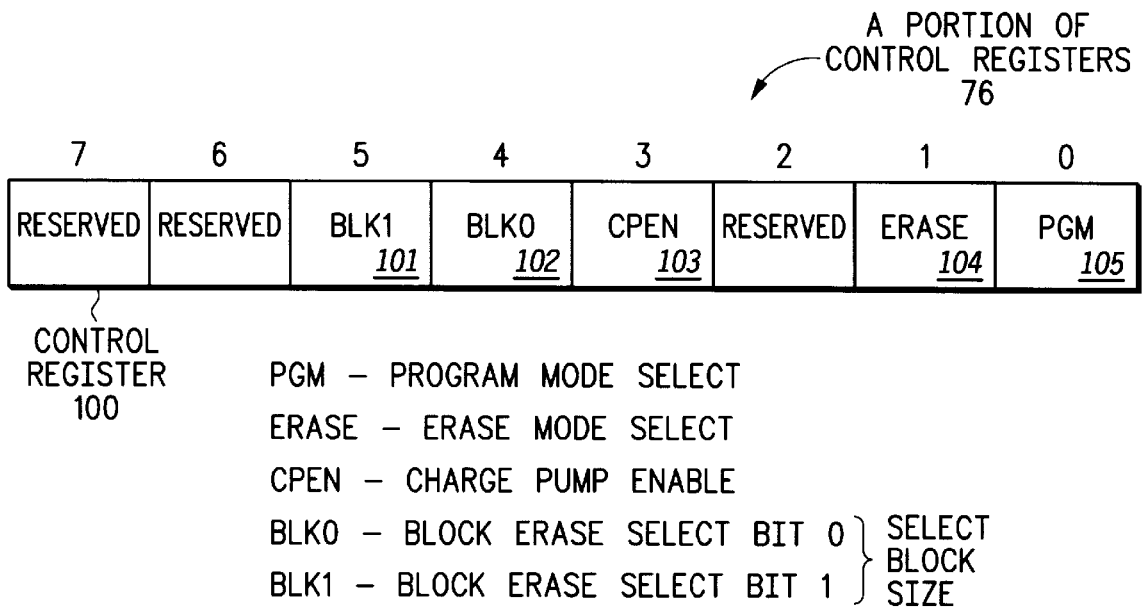
FIG. 3 illustrates, in block diagram form, a portion of control registers 76 of FIG. 2 in accordance with one embodiment of the present invention.
Figure 4:
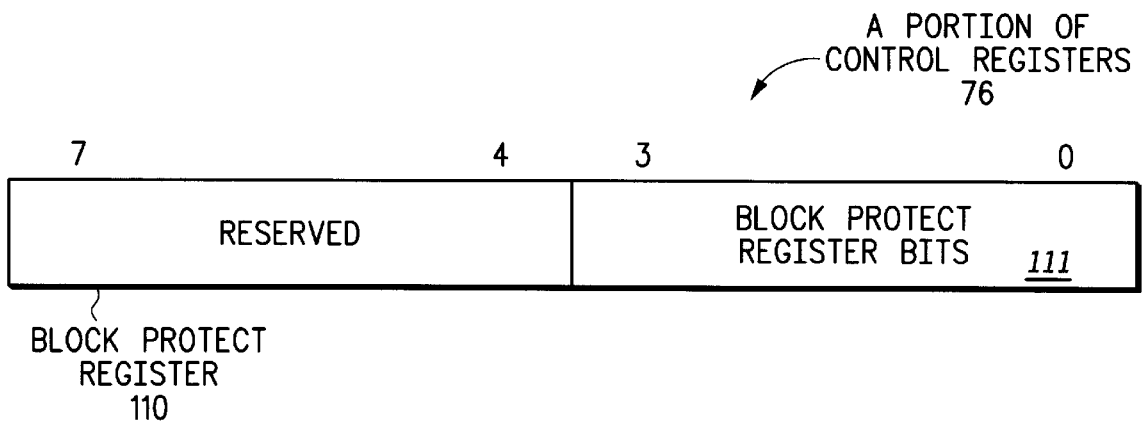
FIG. 4 illustrates, in block diagram form, a different portion of control registers 76 of FIG. 2 in accordance with one embodiment of the present invention.

FIG. 3 illustrates one embodiment of a control register 100, which is a portion of control registers 76, and FIG. 4 illustrates one embodiment of a block protect register 110, which is a portion of control registers 76. The bit fields of these registers and their effect on EEPROM 22 are discussed herein below.

FIG. 5 illustrates, in flow diagram form, an erase procedure for EEPROM 22 in accordance with one embodiment of the present invention. Rectangles 510–518 and 520 represent steps which are performed during the erase procedure. Oval 500 represent the starting point of the erase procedure, and oval 501 represents the finishing point of the erase procedure. Diamonds 530–531 represent decisional points in the erase procedure. Alternate embodiments of the present invention may use a different erase procedure. The erase procedure illustrated in FIG. 5 is discussed in detail herein below.

FIG. 6 illustrates, in flow diagram form, a program procedure for EEPROM 22 in accordance with one embodiment of the present invention. Rectangles 610, 613–618 and 620 represent steps which are performed during the program procedure. Oval 600 represent the starting point of the program procedure, and oval 601 represents the finishing point of the program procedure. Diamond 631 represents a decisional point in the program procedure. Alternate embodiments of the present invention may use a different program procedure. The program procedure illustrated in FIG. 6 is discussed in detail herein below.

FIG. 7 illustrates, in state diagram form, the operation of the block protect control circuitry 72 of FIG. 2 in accordance with one embodiment of the present invention. In one embodiment, FIG. 7 includes states 700–706 and paths 710–723 which indicate the conditions used to move between states. The state diagram illustrated in FIG. 7 is discussed in detail herein below.

Operation of the Preferred Embodiment

In one embodiment of the present invention, EEPROM 22 receives an external signal 24 (see FIG. 1). In one embodiment of the present invention, the signal 24 is required to be active high in order for a modification (i.e. program or erase) of the block protect register 110 (see FIG. 4) to occur. In order to be active high, signal 24 needs to have a voltage signal of 12 volts. This high voltage requirement provides for additional data protection, assuring that accidental erasure or programming does not occur. For signal 24, alternate embodiments of the present invention may instead use an active low signal or an asserted signal that is less positive or is negative compared to VDD.

FIG. 2 illustrates one embodiment of EEPROM 22 of FIG. 1. The bus interface circuitry 70 provides an interface to information bus 30 (see FIG. 1). In a normal manner, the interface circuitry 70 provides address signals 65 to row decode circuitry 64, which, in turn selects a word line in order to identify a specific block (e.g. 57, 56, or 50). Also in a normal manner, the address signals 63 are decoded by column decode block 66 to generate a column decode signal which is used to chose among memory elements in the array 68. The data I/O and programming circuitry 60 is coupled to receive address and control signals 82, and data signals 67, which control data flow to the array 68. A block 75 includes the block protect control circuit 72 and the control register 76. The block 75 receives the data signals 67 and the address and control signals 82. Based on these signals and their values, the block 75 provides a charge pump enable signal 29 to the charge pump 78.

Functionally, block 75 operates to enable the charge pump 78. In order for this to occur, the block protect control circuitry 72, recognizes when a read of the block protect register 110 (FIG. 4) has occurred and latches the value of the block register 110. This block register 110 maintains the information for individual blocks of the EEPROM array 68 which specifies the status of the respective blocks. After the value of the block register 110 is latched and stored, a final qualification occurs which depends upon the address location being accessed and the size of the block being protected.

The final qualification determines which block of array 68 is being addressed, based on the address location being accessed and the size of the block being protected. Depending on the block size in the control register represented by bit values BLK1 101 and BLK0 102 (see FIG. 3), only a given number of address bits of the address received from bus 30 will be used to identify the block. Therefore, the address bits being used will define the block being accessed. Once the block being accessed is identified, its availability for programming will be qualified by the information in the control registers 76. For example, if the block protect register 110 prohibits writing to block 57 and an access to block 57 is being attempted, an invalid situation occurs and the final qualification will not allow the charge pump 78 to be enabled. In this manner a new level of write protection is provided to the array 68, as charge pump 78 will not provide the voltage needed to program array 68. If an appropriate voltage is not provided from charge pump 78 to the high voltage decode 62, the high voltage lines 96, 97, and 90 are not driven to appropriate voltages and a write to array 68 is not possible.

FIG. 3 illustrates one embodiment of a control register 100, which is a portion of control registers 76. In control register 100, control bits 2, 6, and 7 are reserved, and therefor not used in the present invention. Bit PGM 105 at bit 0 represents the program mode select. ERASE 104 is at bit 1 and is the erase mode select, which allows for either bulk erase or a block erase, depending on the values of the bits BLK1 101 and BLK0 102. CPEN 103 is located at bit 3 of control register 100 and is the charge pump enable bit. BLK0 102 is the block erase select bit 0 and resides at bit 4 of control register 100. Combined, bits BLK1 101 and BLK0 102 specify a block size used to qualify a write access to array 68. Note that in one embodiment of the present invention, the register bits in control register 100 are user programmable by performing a write access (e.g. from CPU 12, see FIG. 1) across bus 30 to control register 100.

FIG. 4 illustrates one embodiment of a block protect register 110, which is a portion of control registers 76. In FIG. 4, the block protect register bits 111 are user programmable bits in which a user may specify whether individual blocks 50–57 of array 68 are write protected or not. In one embodiment of the present invention, only a portion of the bits in register 110 are used, while the other bits are reserved. Note that in one embodiment of the present invention, the register bits in block protect register 110 are user programmable by performing a write access (e.g. from CPU 12, see FIG. 1) across bus 30 to block protect register 110. Note that alternate embodiment of the present invention may use any number of bits in the block protect register bits 111.

FIG. 5 illustrates, in flow diagram form, a method of implementing an EEPROM erase procedure in accordance with one embodiment of the present invention. The flow starts at block 500 and proceeds to step 513 where the erase bit 104 (see FIG. 3) is asserted, thereby enabling the array 68 to be erased. The flow then proceeds to step 510 where a read from the block protect register 110 occurs. Next, at step 530, a determination is made on whether or not a bulk erase or a block erase is to be performed. In the event that a bulk erase is to be performed, flow proceeds to step 512; whereas, if a block erase is to be performed, flow continues at step 511.

At step 512, the block erase select bits BLK0 102 and BLK1 101 are cleared, thereby indicating a bulk erase. At step 511, the block erase select bits BLK0 102 and BLK1 101 (FIG. 3) are programmed to determine the block size to be erased. Flow from steps 511 and 512 proceeds to step 514. At step 514, a write is performed to any address within the block to be erased. The value of the data being written is irrelevant for purposes of step 514. For example, if a first block residing between address locations $00 and address locations $80 were to be erased, a write to address location $16 would cause all of the first block to be erased, regardless of the data value that was attempted to be written to location $16.

Next, at step 515, a user software instruction executed by CPU 12 attempts to assert the charge pump enable bit (CPEN) 103. Whether user software can assert CPEN 103 depends upon the results of step 514, because if the address written to in step 514 is to a block in array 68 protected by the block protect register 110, then at step 515 the CPEN bit 103 will not be asserted regardless of what the user software does. Next, at step 531, a determination is made as to whether or not the CPEN 103 bit was asserted during step 515. If the CPEN bit 103 was not asserted in step 515, flow proceeds to step 520. If the CPEN bit 103 was asserted in step 515, then flow proceeds to step 516. At step 516, a delay occurs for the array erase duration. It is during this delay that the erase of the block of array 68 is actually being performed. This requires a specific amount of time which can be controlled by software or by a hardware counter.

Next at step 517, the CPEN bit 103 is negated. In the present embodiment, this is performed by user software. Next at step 518, the erase bit 104 is negated. Finally at step 501, the erase procedure is completed. Returning to step 520 (i.e. where the flow continues following a CPEN bit 103 not being asserted in step 515), the ERASE bit 104 is negated by hardware which detects the invalid write condition. Next flow continues at step 501 where the erase procedure is finished, regardless or whether or not an erase within array 68 actually took place.

FIG. 6 illustrates, in flow diagram form, a method of implementing an EEPROM program procedure in accordance with one embodiment of the present invention. The individual steps of FIG. 6 are similarly numbered to those corresponding steps of FIG. 5. For example, step 613 in FIG. 6 would correspond to similar step 513 in FIG. 5. FIG. 6 differs from FIG. 5 in that steps 530, 512 and 511 have no analogous steps in FIG. 6. These steps are not needed in the program/write procedure of FIG. 6 because an erase is not occurring. Step 614 differs from step 514 in that step 514 effectively selected a block to be erased; whereas in step 614, the data is being programmed, or written to an actual address. For example, if it is desired to write to address $16 with a value $88, the value $88 does have significance and the actual address location $16 would be selected as the write location, as opposed to step 514 which selects the entire corresponding block for erasure. The remaining steps in the flow diagram of FIG. 6 correspond to the steps of the flow diagram of FIG. 5, except that the steps in FIG. 6 are for programming, not erasing EEPROM 22.

FIG. 7 illustrates, in state diagram form, the operation of the block protect control circuitry 72 of FIG. 2 in accordance with one embodiment of the present invention. Out of reset (state 706), and during normal operation, the operation will be in a state 700. Flow remains in state 700 until either the erase mode select bit (ERASE) 104 or the program mode select bit (PGM) 105 is asserted. When either the ERASE bit 104 or the PGM bit 105 is asserted, flow proceeds to a state 701, where either an erase mode (see FIG. 5) or a program mode (see FIG. 6) is selected. Flow returns to state 700 from state 701 if the ERASE bit 104 or the PGM bit 105, whichever one was asserted during path 710, is then negated while in state 701. If neither the ERASE bit 104 nor the PGM bit 105 is negated while in state 701, flow remains in state 701 until the read of the block protect register 110 occurs, causing the flow to move to state 702.

In state 702, the data stored in the block protect register 110 is latched and stored. In state 702, subsequent reads of the block protect register 110 will cause the most current value in the block protect register 110 to be latched and stored, overwriting the previously stored value. Flow will remain in state 702 until a write occurs to the EEPROM array 68, in which case the flow proceeds to state 703, or until the ERASE bit 104 or the PGM bit 105 (whichever one was asserted during path 710) is negated. At state 703, an address compare is performed, comparing the address of the present access to the addresses of the write protected blocks (i.e. the value latched and stored from the block protect register 110). If the result of the address compare shows that the present access is to a write protected address, the flow will immediately proceed to the initial step 700. Similarly, at state 703, if the ERASE bit 104 or the PGM bit 105 (whichever one was asserted during path 710) is negated, flow will also immediately proceed to the initial step 700. Otherwise, the flow will remain in step 703 until the charge pump enable bit 103 is asserted.

Upon assertion of the CPEN bit 103, flow will proceed to state 704. At state 704, the charge pump is enabled by asserting the charge pump enable signal 29 (see FIG. 2). Flow will remain in state 704 until the CPEN bit 103 is negated. This will occur following a program or erase of the appropriate portions of the EEPROM 22. Once the CPEN bit 103 is negated, flow proceeds from state 704 to state 705 where a high voltage discharge of charge pump circuitry 78 is performed. Flow will proceed from step 705 to the initial step 700 following the negation of the PGM bit 105 or the ERASE bit 104 (see FIG. 3).

While the present invention has been illustrated and described with reference to specific embodiments, further modifications and improvements will occur to those skilled in the art. For example, array 68 may be partitioned into any positive, whole number of blocks. EEPROM 22 may be incorporated as part of a microcontroller or other type of integrated circuit, may be incorporated as part of a programmable logic array, or may be a stand alone memory integrated circuit. Array 68 may have any number of memory cells, and may be arranged in any number of rows and columns. Alternate embodiments of the present invention may use row decoder circuitry 64 instead of column decode/block select circuitry 66 to provide the block select signals to erase circuitry 62.

In alternate embodiments of the present invention, a block 50–57 may include only a portion of a row. In alternate embodiments of the present invention any type of erase voltage driver circuit which provides the appropriate erase voltage to array 68 may be used. Charge pump 78, which may use a capacitor (not shown) is one type of erase voltage driver circuit which may be used in the present invention. Alternate embodiments of the present invention may use other types of erase voltage driver circuits. Also, in alternate embodiments of the present invention, processing unit 12 may be implemented as a gate array.

It is to be understood, therefore, that this invention is not limited to the particular forms illustrated and that the appended claims cover all modifications that do not depart from the spirit and scope of this invention.

We claim:

1. A method for operating an Electrically Erasable PROM array, comprising steps of:
    receiving a request to erase or program the Electrically Erasable PROM array, wherein said step of receiving a request comprises a step of receiving a plurality of address signals; and
    requiring a sequence of steps to selectively enable erasing or programming of the Electrically Erasable PROM array;
the sequence of steps to selectively enable erasing or programming of the Electrically Erasable PROM array comprising steps of:
    performing a software read access to a block protect register, the block protect register storing a block protect value;
    comparing at least a portion of the block protect value to at least a portion of the plurality of address signals;
    if the at least a portion of the block protect value corresponds to the at least a portion of the plurality of address signals, inhibiting erasing and programming of the Electrically Erasable PROM array;
    if the at least a portion of the block protect value does not corresponds to the at least a portion of the plurality of address signals, continuing the sequence of steps to selectively enable erasing or programming of the Electrically Erasable PROM array;
    performing a write access to a charge pump enable bit to assert the charge pump enable bit; and
    if the charge pump enable bit is successfully asserted, enabling a charge pump.

2. A method as in claim 1, wherein the block protect register is located within the Electrically Erasable PROM array.

3. A method as in claim 2, wherein the charge pump enable bit is not located within the Electrically Erasable PROM array.

4. A method as in claim 1, herein said step of inhibiting erasing and programming of the Electrically Erasable PROM array comprises a step of determining that the at least a portion of the block protect value matches the at least a portion of the plurality of address signals.

5. An integrated circuit, comprising:
    an Electrically Erasable PROM memory array;
    a charge pump circuit, coupled to said Electrically Erasable PROM memory array, said charge pump circuit providing a voltage to said Electrically Erasable PROM memory array for erasing and programming said Electrically Erasable PROM memory array;
    protection sequence circuitry for requiring that a sequence of steps be performed to enable erasing and programming of said Electrically Erasable PROM memory array;
    charge pump protection circuitry, coupled to said charge pump and to said protection sequence circuitry, said charge pump protection circuitry enabling operation of said charge pump circuit as a result of said protection sequence circuitry indicating that the sequence of steps to enable erasing and programming of said Electrically Erasable PROM memory array had been successfully completed; and
    a processor, coupled to said Electrically Erasable PROM memory array, said processor executing a plurality of instructions as part of the sequence of steps to enable erasing and programming of said Electrically Erasable PROM memory array;
wherein said plurality of instructions includes a first instruction which performs a read access as part of the sequence of steps performed to enable erasing and programming of said Electrically Erasable PROM memory array.

6. An integrated circuit as in claim 5, further comprising:
    a first storage circuit for storing a block protect value.

7. An integrated circuit, as in claim 6, further comprising:
    a signal, received from external to the integrated circuit, the signal being required to erase or program the first storage circuit which stores the block protect value.

8. An integrated circuit as in claim 6, where said first storage circuit storing the block protect value is located within said Electrically Erasable PROM memory array.

9. An integrated circuit as in claim 6, further comprising:
    a second storage circuit for storing a charge pump enable value.

10. An integrated circuit as in claim 9, where said second storage circuit storing the charge pump enable value is not located within said Electrically Erasable PROM memory array.

11. An integrated circuit as in claim 5, wherein said integrated circuit comprises a microcontroller.

12. An integrated circuit, as in claim 5, wherein said read access accesses a register that stores a block protect value.

13. An integrated circuit, as in claim 5, wherein said plurality of instructions includes a second instruction which performs a write access as part of the sequence of steps performed to enable erasing and programming of said Electrically Erasable PROM memory array.

14. An integrated circuit, as in claim 13, further comprising:
   a first storage circuit for storing a block protect value; and
   a second storage circuit for storing a charge pump enable value;
wherein the read access by said processor is to the first storage circuit for reading the block protect value, and wherein the write access is to the second storage circuit for writing the charge pump enable value.

15. A block erasable Electrically Erasable PROM memory apparatus for use in a microcontroller, comprising:
   a memory array of Electrically Erasable PROM (EEPROM) memory cells having a programming voltage terminal for receiving a programming voltage to allow writing of data to the EEPROM;
   a charge pump having a charge pump enable input for receiving an enable signal, wherein the charge pump is used for generating the programming voltage, when the enable signal is active; and
   a protect control block coupled to the charge pump for generating an active enable signal when a memory area of the memory array is in a write state, and generating an inactive enable signal when the memory area is in a protected state;
wherein the protect control block comprises:
   a write protect memory area for identifying which portions of the memory array are in a protected state; and
   a decode block coupled to the write protect memory area, wherein the decode block generates the enable signal based on a value stored in the write protect memory area.

16. The apparatus of claim 15, wherein the protect control block further comprises:
   a charge pump enable bit.

* * * * *